(12) United States Patent
Kayama et al.

(10) Patent No.: US 6,761,586 B2
(45) Date of Patent: Jul. 13, 2004

(54) BOARD CONNECTOR AND METHOD OF ATTACHING BOARD CONNECTOR

(75) Inventors: Shinobu Kayama, Haibara-gun (JP); Shinji Kodama, Haibara-gun (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 10/052,397

(22) Filed: Jan. 23, 2002

(65) Prior Publication Data

US 2002/0098723 A1 Jul. 25, 2002

(30) Foreign Application Priority Data

Jan. 23, 2001 (JP) ..................................... P2001-014561

(51) Int. Cl.$^7$ ............................................. H01R 13/60
(52) U.S. Cl. ...................................................... 439/567
(58) Field of Search ........................................ 439/567

(56) References Cited

U.S. PATENT DOCUMENTS 6,083,044 A * 7/2000 Wang et al. ................. 439/567

FOREIGN PATENT DOCUMENTS

| JP | 11-260521 | 2/1994 |
| JP | 6-052913 | 9/1999 |

* cited by examiner

Primary Examiner—Renee Luebke
Assistant Examiner—Ann McCamey
(74) Attorney, Agent, or Firm—Sughrue Mion, PLLC

(57) ABSTRACT

The tip end portions of positioning projections protruded on the attachment surface of an insulation housing opposing to a circuit board are respectively inserted into positioning holes provided at the circuit board thereby to position the board connector relatively with respect to the circuit board. Thereafter, the tip end portions of terminals protruding in the attachment direction from the attachment surface are inserted into the through holes of the circuit board, and also the tip end portions of attachment arms provided at the both side surfaces of the insulation housing and protruding in the attachment direction are inserted into attachment holes provided at the circuit board thereby to have engagement projections provided at the tip ends of the attachment arms pass through and engage with the attachment holes, respectively, whereby the board connector is fixed to the circuit board.

10 Claims, 4 Drawing Sheets

BOARD CONNECTOR AND METHOD OF ATTACHING BOARD CONNECTOR

CROSS REFERENCE TO RELATED APPLICATION

The present application is based on Japanese Patent Application No. 2001-14561, the entire contents of which are incorporated herein by reference.

BACKGROUND OF THE INVENTION

1. Field of the Invention

The present invention relates to a method of attaching a board connector to be attached to a circuit board, and the board connector as well as the attachment structure of the same.

2. Related Art

As shown in FIGS. 6 and 7, a conventional board connector 101 is provided with a multiplicity of print circuit board (PCB) terminals 107 protruding from the lower surface 105 (the lower direction in FIG. 6) of an insulation housing 103 and also provided with attachment brackets 109 protruding outside from the lower end portions of the left and right side surfaces (left and right side surfaces in FIG. 6) 103L, 103R of the insulation housing 103, respectively.

As shown in FIG. 8, in the case of attaching the board connector 101 configured in the aforesaid manner to an electric circuit board 111, it has been generally performed that the PCB terminals 107 are inserted into the predetermined through holes 113 of the electric circuit board 111, and screws 117 are threaded into screw holes 115 provided at the electric circuit board 111 thereby to fix the attachment bracket 109 of the board connector 101 to the board.

However, in the case of fixing the board connector 101 to the board 111 by means of the screws 117 in the aforesaid manner, the number of the manufacturing processes increases due to the fastening process of the screws. Further, screw attachment portions such as the attachment brackets 109 may be broken due to an excessive torque caused by the fastening operation of the screws 117, so that a worker is required to perform the fastening processes carefully. Thus, there arises a problem that the cost of a product increases.

Further, when the screws 117 are not suitably fastened, the board connector 101 is not surely fixed to the electric circuit board 111 and so may wobble thereby to cause loose connection.

Further, in the case of fixing the board connector 101 to the electric circuit board 111, it is required to pass the multiplicity of PCB terminals 107 through the predetermined through holes 113. Thus, the board connector 101 is required to be positioned accurately with respect to the electric circuit board 111, and so there arises a problem that the positioning procedure is troublesome.

In view of such problems, a board connector as disclosed in Japanese Unexamined Patent Publication No. JP 06-A-52913 is proposed.

That is, as shown in FIG. 9, a board connector 119 is arranged so as to be attached to an electric circuit board easily in a manner that attachment leg portions 125 having engagement projections 123 at the tip portions thereof are provided at both side surfaces 121L, 121R of an insulation housing 121, respectively, and the attachment leg portions are engaged with the not-shown attachment holes of the electric circuit board, respectively.

However, even in the board connector 119 disclosed in the aforesaid JP 06-A-52913, the positioning procedure is also difficult at the time of attaching the board connector 119 to the electric circuit board. That is, it is first required to insert PCB terminals 127 into not-shown predetermined through holes before engaging the attachment leg portions 125 with the attachment holes of the electric circuit board. In this case, there arises a problem that it is difficult to insert the multiplicity of the PCB terminals 127 into the plurality of the through holes simultaneously, and the PCB terminals 127 may be bent when these terminals are not being inserted correctly.

SUMMARY OF THE INVENTION

Accordingly, an object of the invention is to obviate the aforesaid problem of the conventional technique and to provide a method of attaching a board connector to a circuit board and the board connector which can easily insert Terminals into the through holes of a circuit board and prevent the wobbling of the connector with respect to the board.

The aforesaid object of the invention can be attained by A method of attaching a board connector, comprising the steps of:

positioning the board connector relatively with respect to the circuit board by inserting a tip end portion of a positioning projection protruding in an attachment direction from an attachment surface of the board connector opposing to a circuit board into a corresponding positioning hole provided at the circuit board;

inserting tip end portions of terminals protruding in the attachment direction from the attachment surface into through holes of the circuit board; and fixing the board connector to the circuit board by engaging an attachment arm provided at a side surface of the board connector and extending in the attachment direction with an attachment portion provided at the circuit board.

The aforesaid object of the invention can be attained by a board connector attachment structure including terminals protruding in an attachment direction from an attachment surface thereof opposing to a circuit board, the attachment structure comprising:

a positioning projection protruding in an attachment direction from the attachment surface, the positioning projection having a projecting height higher than projection heights of the terminals from the attachment surface, the positioning projection being inserted into a positioning hole provided at the circuit board prior to insertion of the terminals into through holes; and an attachment arm provided at a side surface of the board connector and protruding in the attachment direction, the attachment arm being engaged with an attachment portion provided at the circuit board, whereby the board connector is fixed to the circuit board.

That is, according to the aforesaid configuration, first, the tip end portion of the positioning projection provided at the attachment surface of the board connector is inserted into the positioning hole provided at the circuit board, whereby the terminals protruding in the attachment-direction from the attachment surface can be inserted into the through holes provided at the circuit board in the state where the board connector is relatively positioned with respect to the circuit board.

Further, since the attachment arm provided at a side of an insulation housing is engaged with the attachment portion of the circuit board, the board connector can be simply and surely fixed to the circuit board.

In the above attachment structure of the board connector, preferably, a groove is formed at a tip end portion of the positioning projection, and the groove is split into at least two pieces in a longitudinal direction of the positioning projection, and the tip end of the positioning projection is elastically deformed in a radial direction of the positioning hole when the positioning projection is inserted into the positioning hole.

Thus, the positioning projection is formed to have a relatively longer length so that the positioning projection can be inserted into the positioning hole of the circuit board prior to the insertion of the tip end portion of the terminals into the through holes. Thus, even when the positioning projection is inserted aslant with respect to the circuit board, since the tip end portion can be deformed elastically in the radial direction of the positioning hole, the insertion property of the positioning projection into the positioning hole is hardly degraded.

After the positioning projections are inserted into the positioning hole, due to the spring function of the positioning projection which tip end portion can be deformed elastically in the radial direction, the positioning projection is prevented from being wobbled with respect to the positioning hole.

In the above attachment structure of the board connector, the positioning projection may have a projecting height higher than a projection height of the attachment arm from the attachment surface.

Further another aspect of the invention can be attained by a board connector comprising terminals protruding in an attachment direction from an attachment surface; a positioning projection protruding in the attachment direction from the attachment surface; and an attachment arm provided at a side surface of the board connector and extending in the attachment direction, the attachment arm having an engagement projection at a tip end thereof;

wherein a projecting height of the positioning projection is provided higher than projection heights of the terminals from the attachment surface.

DETAILED DESCRIPTION OF THE PREFERRED EMBODIMENTS

An embodiment of the invention will be explained in detail with reference to the accompanying drawings.

Figure 1:
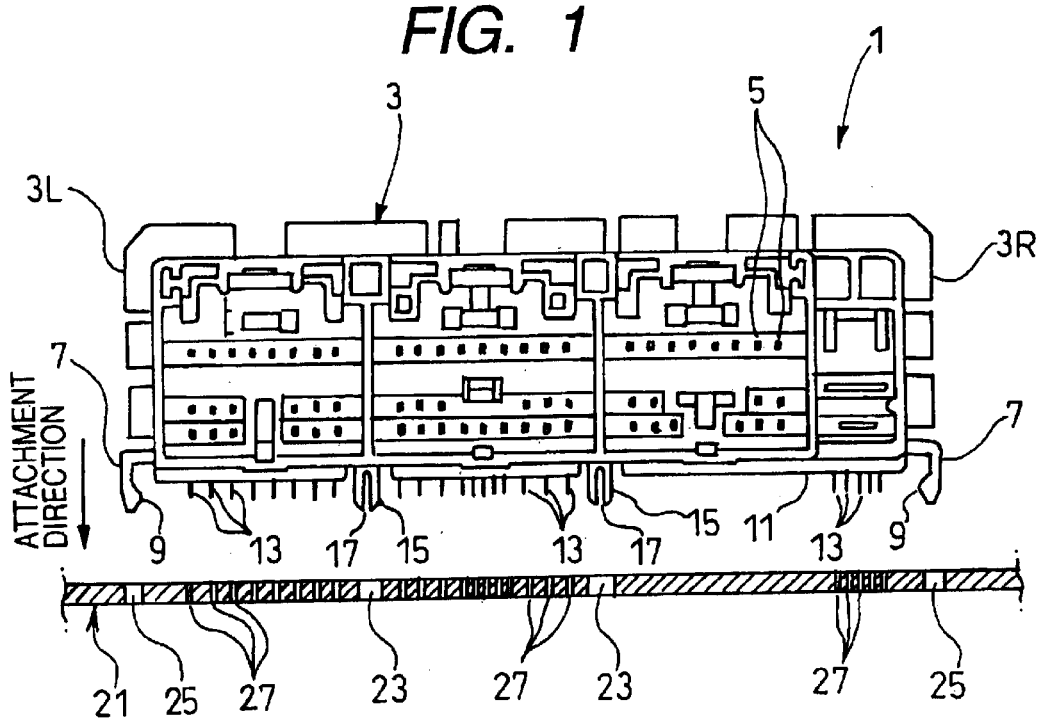
FIG. 1 is a front view showing a board connector according to an embodiment of the present invention.
Figure 2:
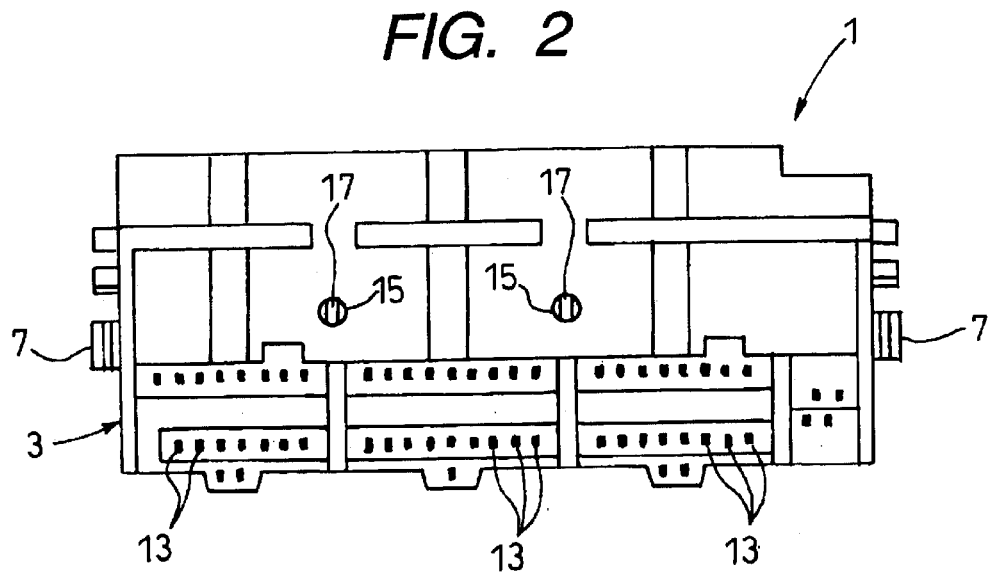
FIG. 2 is a bottom view of the board connector shown in FIG. 1.

A board connector 1 according to the embodiment has an insulation housing 3 configured in an almost rectangular box shape having an opening at the front portion thereof as shown in FIGS. 1 and 2. Many jacks 5 for coupling another connector (not shown) thereto is provided at the opened front surface (this side in FIG. 1) of the insulation housing 3 in a manner of being divided into various groups.

Almost L-shaped attachment arms 7 are provided at portions near the lower end portions of the both side surfaces 3L, 3R (left and right side surfaces in FIG. 1) of the insulation housing 3, respectively. Engagement projections 9 protrude at the insides of the tip end portions of the attachment arms extending in an attachment direction (a lower direction in FIG. 1) (see FIG. 3), respectively Further, a multiplicity of Terminals (print circuit board terminals) 13 coupled to the jacks 5 are provided on the attachment surface (a lower surface in FIG. 1) of the insulation housing 3 so as to protrude in the attachment direction. Furthermore, a pair of positioning projections 15, 15 are provided integrally on the attachment surface 11 so as to protrude in the attachment direction.

Figure 3:
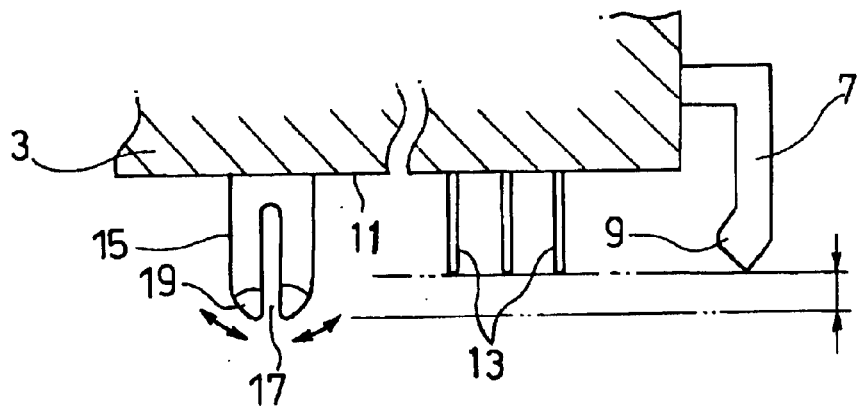
FIG. 3 is an enlarged diagram showing a main portion of the board connector shown in FIG. 1.

The tip end (a lower end in FIG. 1) of each of the positioning projections 15 protrudes in the attachment direction from the tip end of the attachment arms 7 and the tip end portions of the PCB terminals 13, as shown in FIG. 3. Thus, at the time of attaching the board connector 1 to a predetermined electric circuit board 21, the positioning projections 15 are first inserted into positioning holes 23 provided at the electric circuit board 21 as shown in FIG. 4.

As shown in FIG. 3, each of the positioning projections 15 is split at its tip end portion 19 in two pieces by a vertically split groove 17 so as to be able to deform elastically in the radial direction (arrow directions in FIG. 3) of the positioning hole 23. Further, the tip end portion 19 of each of the positioning projections 15 is entirely formed to be round so as to be able to be easily inserted into the positioning hole 23 of the electric circuit board 21.

The explanation will be made as to a method of attaching the board connector 1 of this embodiment configured in the aforesaid manner to the electric circuit board 21.

Figure 4:
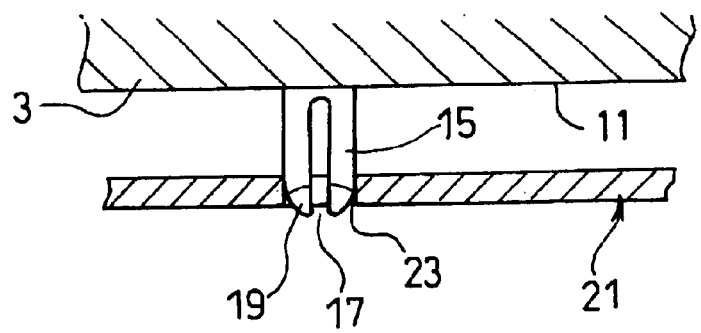
FIG. 4 is an enlarged sectional view for explaining an insertion state of a positioning projection shown in FIG. 3.

First, as shown in FIG. 4, the tip end portions 19 of the positioning projections 15 protrusively provided on the attachment surface 11 of the insulation housing 3 of the board connector 1 are inserted into the positioning holes 23 provided at the electric circuit board 21, respectively, whereby the board connector 1 can be positioned relatively with respect to the electric circuit board 21.

Figure 5:
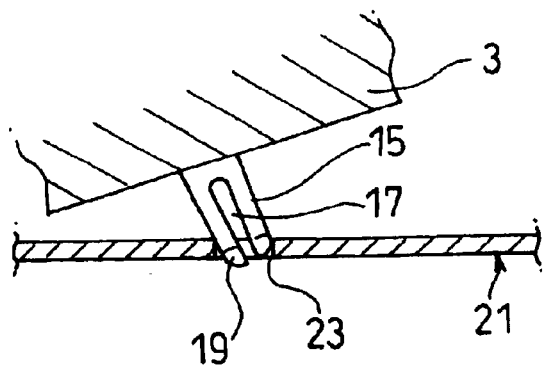
FIG. 5 is an enlarged sectional view for explaining a state where the positioning projection shown in FIG. 4 is inserted aslant into a positioning hole.
Figure 6:
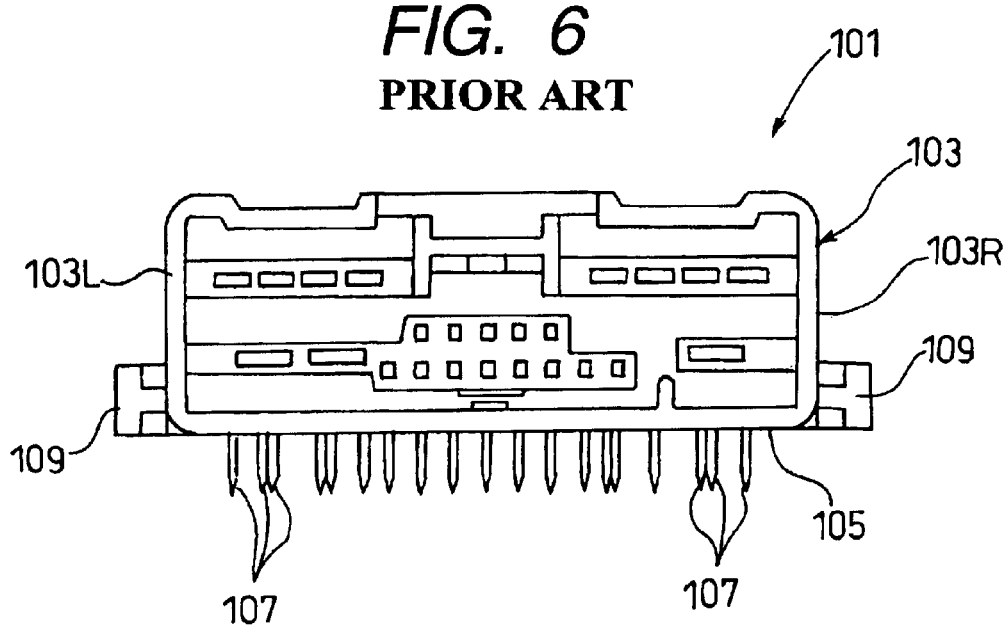
FIG. 6 is a front view showing an example of conventional board connectors.
Figure 7:
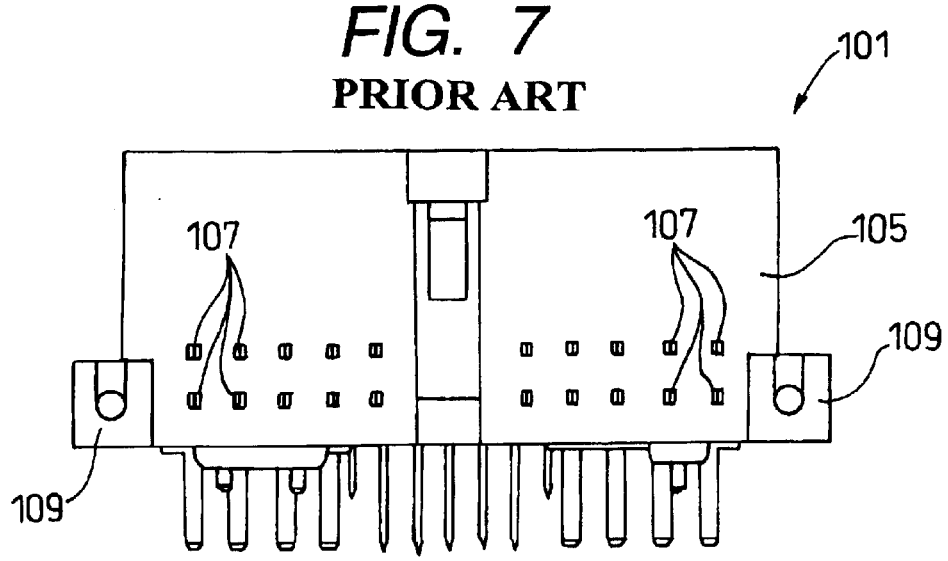
FIG. 7 is a bottom view of the board connector shown in FIG. 6.

In this respect, each of the positioning projections 15 is formed to have a relatively longer length so that the positioning projections can be inserted into the positioning holes 23 of the electric circuit board 21 prior to the insertion of the tip end portions of the PCB terminals 13 into the through holes 27. Thus, even when the positioning projection is inserted aslant with respect to the electric circuit board 21 as shown in FIG. 5, since the tip end portion 19 can be deformed elastically in the radial direction of the positioning hole 23, the positioning projection 15 can follow along the opening edge of the positioning hole and be inserted smoothly therein, so that the insertion property of the positioning projections into the positioning holes 23 is hardly degraded.

Then, when the insulation housing 3 is moved in the attachment direction in a state where the board connector 1 is positioned relatively with respect to the electric circuit board 21, the multiplicity of the PCB terminals 13 protruding in the attachment direction from the attachment surface 11 can be inserted easily into the through holes 27 provided at the electric circuit board 21, respectively.

Then, the attachment arms 7 provided at the both sides of the insulation housing 3 are engaged with attachment holes 25 serving as the attachment portions of the electric circuit board 21, respectively, so that the board connector 1 can be simply and surely fixed to the electric circuit board 21.

Figure 8:
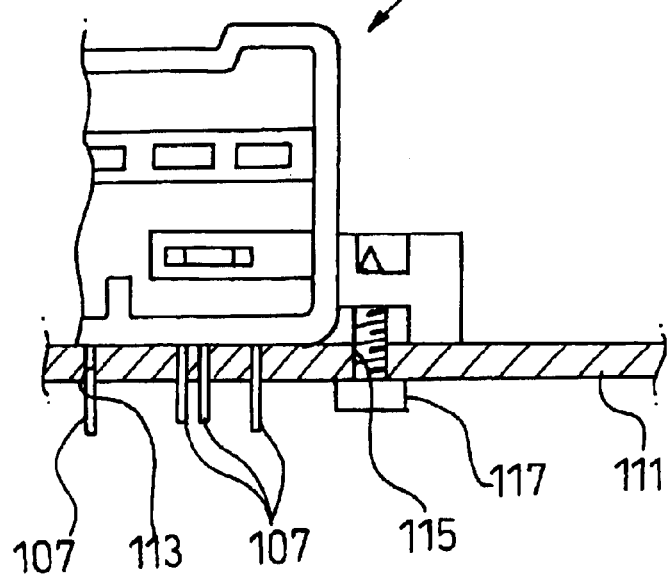
FIG. 8 is an enlarged diagram of a main portion showing the attachment state of the board connector shown in FIG. 6.
Figure 9:
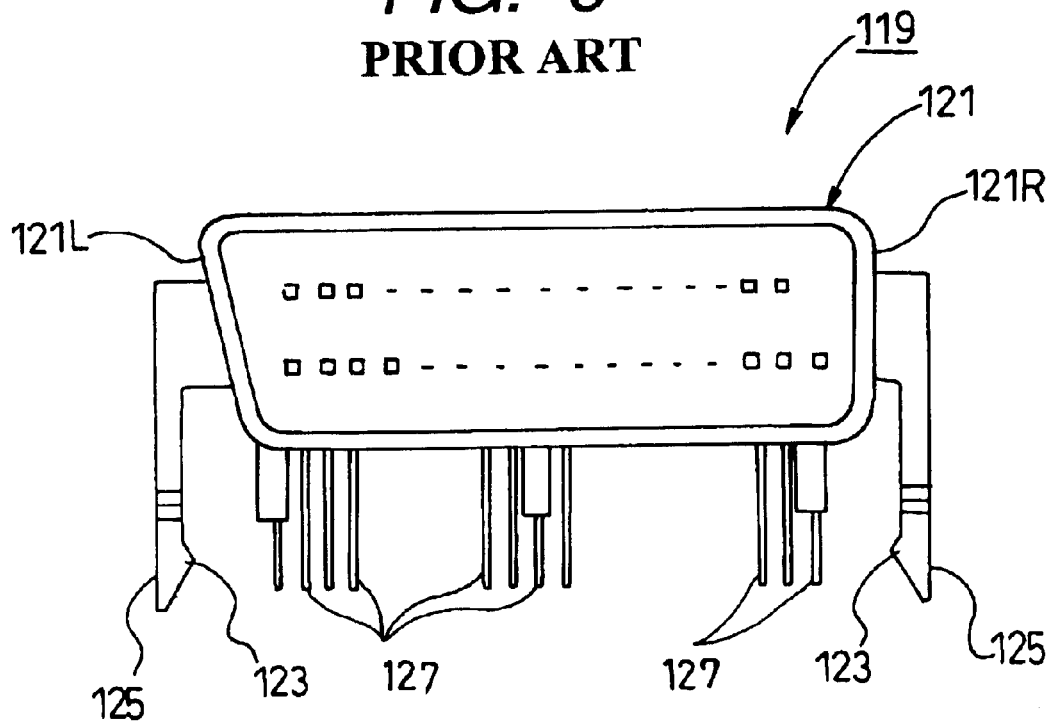
FIG. 9 is a front view showing another example of conventional board connectors.

That is, unlike the conventional board connector shown in FIGS. 8 and 9, the board connector 1 according to the embodiment is not fixed to the electric circuit board by using screws. The board connector according to the embodiment is fixed to the electric-circuit board in a manner that the engagement projections 9 of the attachment arms 7 are pushed into and engaged with the attachment holes 25 of the electric circuit board 21, respectively, so that the fixing procedure can be performed easily and the number of the assembling procedure can be reduced. Further, the occurrence of such a phenomenon that the attachment portion is broken due to the excessive fastening of the screws can be prevented.

Further, at the time of attaching the board connector 1 to the electric circuit board 21, all of the PCB terminals 13 can also be positioned with respect to the through holes 27 by merely inserting the positioning projections 15 into the positioning holes 23 of the electric circuit board 21, respectively.

Thus, since the PCB terminals 13 can surely be inserted into the through holes 27, it is possible to prevent the occurrence of such a phenomenon that the PCB terminal 13 is not inserted into the through hole suitably and so being bent. Thus, the attachment procedure can be performed easily.

Further, since each of the positioning projections 15 is split at its tip end portion 19 in two pieces by the vertically split groove 17 and so deforms elastically in the radial direction, the positioning projection 15 can be held surely within the positioning hole 23 due to the spring function of the positioning projection after attaching the board connector 1 to the electric circuit board 21. Thus, the wobbling of the board connector 1 with respect to the electric circuit board 21 can be prevented and so the loose connection of the conduction portion can be prevented.

Although in the aforesaid embodiment, the attachment arm 7 is provided at each of the both side surfaces 3L, 3R of the insulation housing 3 and a pair of the positioning projections 15 are provided on the attachment surface 11, the invention is not limited thereto, and the number of the attachment arms and the number of the positioning projections may be suitably increased depending on the shape (depth) or size of the board connector 1.

Further, although in the aforesaid embodiment, the explanation has been made as to the case where each of the positioning projections 15 is split at its tip end portion 19 in two pieces by the vertically split groove 17, each of the positioning projections may be split at its tip end portion in three or more pieces by the two or more vertically split grooves.

Furthermore, although in the aforesaid embodiment, the board connector 1 is fixed to the electric circuit board 21 in a manner that the engagement projections 9 of the attachment arms 7 are pushed into and engaged with the attachment holes 25 of the electric circuit board 21, respectively, the board connector may be fixed to the electric circuit board in a manner that the electric circuit board is sandwiched by the attaching arms at the attaching portions provided at the electric circuit board serving as board end edges.

As described above, according to the board connector attaching method and the board connector of the invention, first, the tip end portions of the positioning projections provided at the attachment surface of the board connector are inserted into the positioning holes provided at the electric circuit board, respectively, whereby the PCB terminals protruding in the attachment direction from the attachment surface can be inserted into the through holes provided at the electric circuit board in the state where the board connector is relatively positioned with respect to the electric circuit board.

Further, since the attachment arms provided at the both sides of the insulation housing are engaged with the attachment portions of the electric circuit board, the board connector can be simply and surely fixed to the electric circuit board.

Accordingly, it is possible to provide the method of attaching the board connector to the electric circuit board and the board connector which can easily insert the PCB terminals into the through holes of the electric circuit board and prevent the wobbling of the connector with respect to the board.

What is claimed is:

1. A method of attaching a board connector, comprising the steps of:
    positioning the board connector relatively with respect to a circuit board by inserting a tip end portion of a positioning projection integrally formed with an attachment surface of the board connector opposing to the circuit board so as to protrude in an attachment direction from the attachment surface into a corresponding positioning hole provided at the circuit board, wherein a projecting length of said positioning projection is greater than projection lengths of said terminals from the attachment surface;
    inserting tip end portions of terminals protruding in the attachment direction from the attachment surface into through holes of the circuit board; and
    fixing the board connector to the circuit board by engaging an attachment arm, independent of said positioning projection provided at a side surface, which is not the attachment surface, of the board connector and extending in the attachment direction with an attachment portion provided at the circuit board, said positioning, inserting and fixing steps occurring in the stated order.

2. The method according to claim 1, wherein the positioning projection protrudes further from the attachment surface than the attachment arm.

3. An attachment structure of a board connector, the board connector including terminals protruding in an attachment direction from an attachment surface thereof opposing to circuit board, said attachment structure comprising:
    a positioning projection integrally formed with the attachment surface of the board connector opposing to the circuit board so as to protrude in an attachment direction from the attachment surface, said positioning projection having a projecting length greater than projection lengths of said terminals from the attachment surface, said positioning projection being inserted into a positioning hole provided at the circuit board prior to insertion of the terminals into through holes; and
    an attachment arm, independent of said positioning projection, provided at a side surface, which is not the attachment surface, of the board connector and protruding in the attachment direction, said attachment arm being engaged with an attachment portion provided at the circuit board, whereby the board connector is fixed to the circuit board.

4. An attachment structure of the board connector according to claim 3, wherein a groove is formed at a tip end portion of said positioning projection, wherein the groove splits said positioning projection into at least two pieces in a longitudinal direction of said positioning projection, and said tip end of said positioning projection is elastically deformed in a radial direction of the positioning hole when said positioning projection is inserted into the positioning hole.

5. An attachment structure of the board connector according to claim 3, wherein the projecting length of said positioning projection from the attachment surface is greater than a projection length of said attachment arm from the attachment surface.

6. An attachment structure of the board connector according to claim 3, wherein the positioning projection protrudes further from the attachment surface than the attachment arm.

7. A board connector comprising:

terminals protruding in an attachment direction from an attachment surface;

a positioning projection protruding in the attachment direction from the attachment surface; and an attachment arm, independent of said positioning projection, provided at a side surface of the board connector and extending in the attachment direction, said attachment arm being substantially L-shaped, provided on a surface which is not the attachment surface, and having an engagement projection at a tip end thereof;

wherein a projecting length of said positioning projection from the attachment surface is greater than projection lengths of said terminals from the attachment surface.

8. A board connector according to claim 7, wherein a groove is formed at a tip end portion of said positioning projection, wherein the groove splits said positioning projection into at least two pieces in a longitudinal direction of said positioning projection so as to be elastically deformed in a direction perpendicular to the attachment direction.

9. A board connector according to claim 7, wherein the projecting length of said positioning projection from the attachment surface is greater than a projection length of said attachment arm from the attachment surface.

10. The board connector according to claim 7, wherein said attachment arm does not serve as terminal for electrical connection.

\* \* \* \* \*